United States Patent
Jin et al.

(10) Patent No.: US 8,124,952 B2
(45) Date of Patent: *Feb. 28, 2012

(54) PROGRAMMABLE RESISTIVE MEMORY CELL WITH FILAMENT PLACEMENT STRUCTURE

(75) Inventors: Insik Jin, Eagan, MN (US); Christina Hutchinson, Eden Prairie, MN (US); Richard Larson, Brooklyn Park, MN (US); Lance Stover, Eden Prairie, MN (US); Jaewoo Nam, Eden Prairie, MN (US); Andrew Habermas, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/014,935

(22) Filed: Jan. 27, 2011

(65) Prior Publication Data
US 2011/0121256 A1    May 26, 2011

Related U.S. Application Data

(63) Continuation of application No. 12/263,562, filed on Nov. 3, 2008, now Pat. No. 7,897,955.

(51) Int. Cl.
*H01L 47/00* (2006.01)

(52) U.S. Cl. ... 257/2; 257/4; 257/E43.001; 257/E31.029
(58) Field of Classification Search ................ 257/2, 4, 257/5, 209, 529, E43.001, E31.029
See application file for complete search history.

(56) References Cited

U.S. PATENT DOCUMENTS

| | | | |
|---|---|---|---|
| 6,423,621 | B2 | 7/2002 | Doan |
| 6,828,678 | B1 | 12/2004 | Koutny, Jr. |
| 6,870,751 | B2 | 3/2005 | Van Brocklin |
| 7,098,503 | B1 | 8/2006 | Marsh |
| 7,208,372 | B2 | 4/2007 | Hsu |
| 7,414,257 | B2 * | 8/2008 | Happ et al. ............ 257/2 |
| 7,626,859 | B2 * | 12/2009 | Suh et al. ............ 365/163 |
| 2004/0109351 | A1 | 6/2004 | Morimoto |
| 2005/0180189 | A1 | 8/2005 | Happ |
| 2010/0006813 | A1 | 1/2010 | Xi |
| 2010/0084741 | A1 | 4/2010 | Andres |

* cited by examiner

*Primary Examiner* — Hoai V Pham
(74) *Attorney, Agent, or Firm* — Mueting, Raasch & Gebhardt PA

(57) ABSTRACT

Programmable metallization memory cells having a first metal contact and a second metal contact with an ion conductor solid electrolyte material between the metal contacts. The first metal contact has a filament placement structure thereon extending into the ion conductor material. In some embodiments, the second metal contact also has a filament placement structure thereon extending into the ion conductor material toward the first filament placement structure. The filament placement structure may have a height of at least about 2 nm.

16 Claims, 11 Drawing Sheets

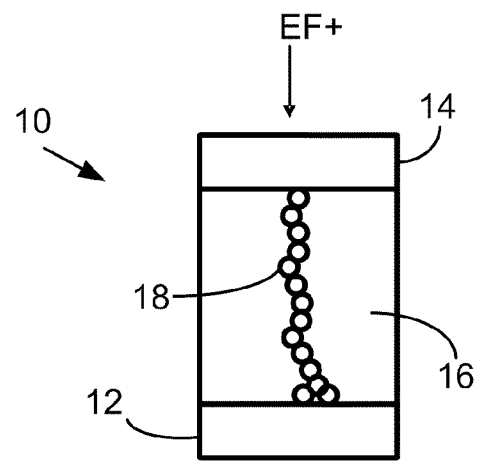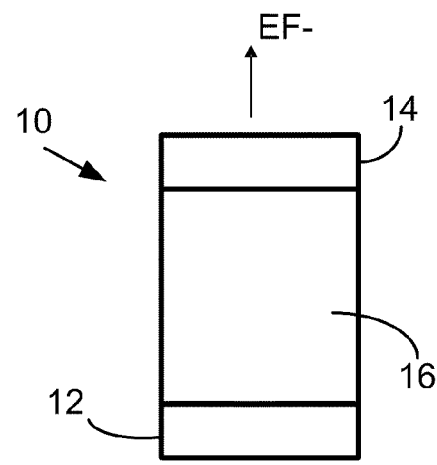
FIG. 1A  FIG. 1B
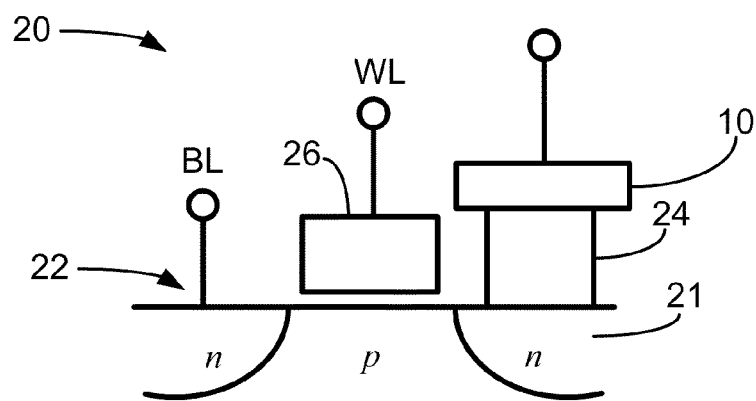
FIG. 2

US 8,124,952 B2

PROGRAMMABLE RESISTIVE MEMORY CELL WITH FILAMENT PLACEMENT STRUCTURE

BACKGROUND

Memory devices are common in electronic systems and computers to store data. These memory devices may be volatile memory, where the stored data is lost if the power source is disconnected or removed, or non-volatile, where the stored data is retained even during power interruption. An example of a non-volatile memory device is a programmable metallization cell (PMC).

A PMC utilizes a fast ion conductor such as a chalcogenide-type or an oxide-type (e.g., NiO) and at least two electrodes (e.g., an anode and a cathode) with the fast ion conductor between the electrodes. When a voltage is applied across the electrodes, superionic clusters or conducting filaments rapidly grow from the cathode through the fast ion conductor towards the anode. When the clusters or filaments are present, the cell is in a low resistance state. When an electric field of opposite polarity is applied across the electrodes, the conducting filaments dissolve and the conducing paths are disrupted, providing the cell with a high resistance state. The two resistance states are switchable by the application of the appropriate electric field and are used to store the memory data bit of "1" or "0".

Although the conducting filaments provide an accurate path for current flow from one electrode to the other, due to the construction of the PMC, the position and occurrence of the filaments is not accurate or reproducible. The present disclosure provides PMCs having improved uniformity and repeatability.

BRIEF SUMMARY

The present disclosure relates to programmable metallization memory cells having a filament placement structure on at least one of the electrode and methods of forming the same are disclosed. The filament placement structure provides a foundation for filament growth from one electrode to the other.

In one illustrative embodiment, the memory cell includes a first metal contact and a second metal contact with an ion conductor solid electrolyte material between the metal contacts. The first metal contact has a filament placement structure thereon extending into the ion conductor material, the filament placement structure having a height of at least about 2 nm.

One illustrative method of forming a programmable metallization memory cell includes forming a filament placement structure on a first metal contact, disposing an ion conductor solid electrolyte material over the first metal contact and filament placement structure, and disposing a second metal contact over the ion conductor material.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 1A is a schematic side view diagram of an illustrative programmable metallization memory cell in a low resistance state; FIG. 1B is schematic side view diagram of the illustrative programmable metallization memory cell in a high resistance state;

FIG. 2 is a schematic diagram of an illustrative programmable metallization memory unit including a semiconductor transistor;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 3:
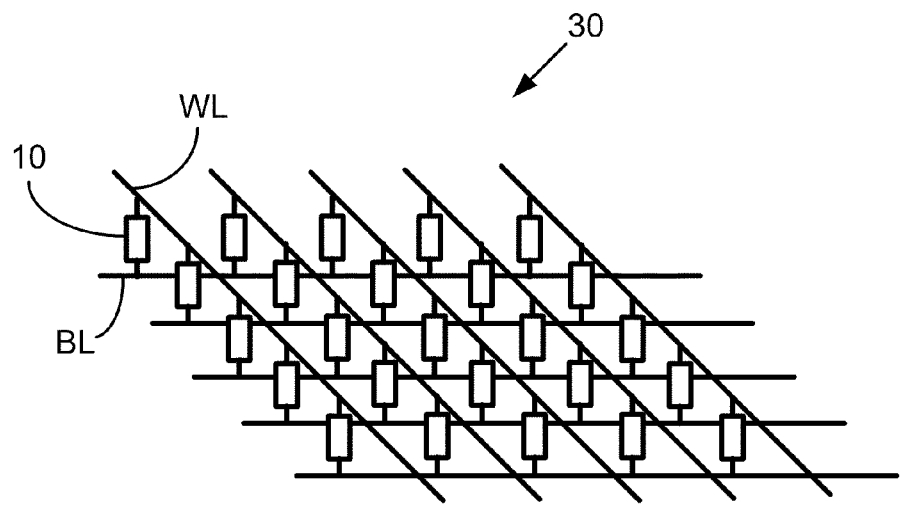
FIG. 3 is a schematic diagram of an illustrative programmable metallization memory array.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to programmable metallization memory cells having a filament placement structure on at least one of the electrode and methods of forming the same. The filament placement structure provides a foundation for positioning a conductive filament or superionic cluster between the two electrodes. In some embodiments, a filament placement structure is present on each electrode.

FIGS. 1A and 1B are a cross-sectional schematic diagrams of an illustrative programmable metallization memory cell 10; in FIG. 1A, memory cell 10 is in the low resistance state and in FIG. 1B, cell 10 is in the high resistance state. Programmable metallization cell (PMC) memory is based on the physical re-location of superionic regions within an ion conductor solid electrolyte material 16. Memory cell 10 includes a first metal contact 12, a second metal contact 14, and an ion conductor solid electrolyte material 16. Ion conductor solid electrolyte material 16 is between first metal contact 12 and second metal contact 14.

First metal contact 12 and second metal contact 14 can be formed of any useful metallic material. In many embodiments, one or both of first metal contact 12 and a second metal contact 14 are formed of electrically conductive yet electrochemically inert metals such as, for example, platinum, gold, and the like. In some embodiments first metal contact 12 and/or second metal contact 14 have two or more metal layers, where the metal layer closest to ion conductor solid electrolyte material 16 is electrochemically inert while additional layers can be electrochemically active.

The ion conductor solid electrolyte material 16 can be formed of any useful material that provides for the formation of conducting filaments 18 or superionic clusters within ion conductor solid electrolyte material 16 and extend between metal contact 12 and metal contact 14 upon application of an electric field EF+. In some embodiments, ion conductor solid electrolyte material 16 is a chalcogenide-type material such as, for example, $GeS_2$, $GeSe_2$, $CuS_2$, and the like. In other embodiments, ion conductor solid electrolyte material 16 is an oxide-type material such as, for example, $NiO$, $WO_3$, $SiO_2$, and the like.

In FIG. 1A, application of an electric field EF+ across metal contact 14 allows cations from metal contact 14 to migrate toward first metal contact 12, forming conducting filaments 18 or superionic clusters within ion conductor solid electrolyte material 16. The presence of conducting filaments 18 or superionic clusters within ion conductor solid electrolyte material 16 reduces electrical resistance between first metal contact 12 and second metal contact 14 and gives rise to the low resistance state of programmable metallization memory cell 10.

Reading memory cell 10 simply requires a small voltage applied across the cell. If conducting filaments 18 are present in that cell, the resistance will be low, leading to higher current, which can be read as a "1". If there are no conducting filaments 18 present, the resistance is higher, leading to low current, which can be read as a "0" as illustrated in FIG. 1B.

Application of an electric field of opposite polarity FE– to memory cell 10 ionizes conducting filaments 18 and moves the ions back to metal contact 14 and gives rise to the high resistance state of memory cell 10. The low resistance state and the high resistance state are switchable with an applied electric field and are used to store the memory bit "1" and "0".

FIG. 2 is a schematic diagram of an illustrative programmable metallization memory unit 20 including a semiconductor transistor 22. Memory unit 20 includes a programmable metallization memory cell 10, as described herein, electrically coupled to semiconductor transistor 22 via an electrically conducting element 24. Transistor 22 includes a semiconductor substrate 21 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory cell 10. An array of programmable metallization memory units 20 can be formed on a semiconductor substrate utilizing semiconductor fabrication techniques.

FIG. 3 is a schematic diagram of an illustrative programmable metallization memory array 30. Memory array 30 includes a plurality of word lines WL and a plurality of bit lines BL forming a cross-point array. At each cross-point a programmable metallization memory cell 10, as described herein, is electrically coupled to word line WL and bit line BL.

Figure 4:
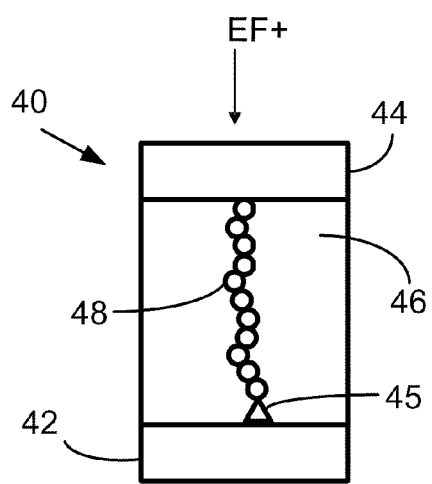
FIG. 4 is a schematic side view diagram of a programmable metallization memory cell having one filament placement structure.
Figure 5:
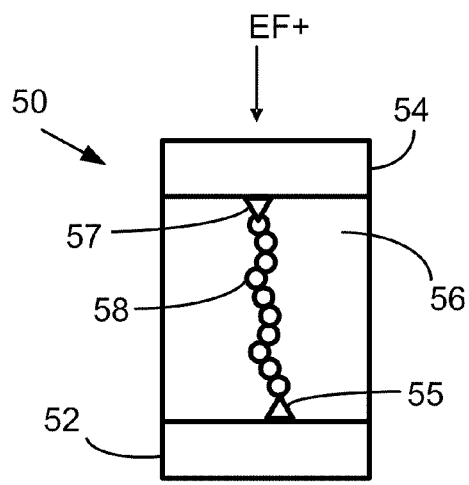
FIG. 5 is a schematic side view diagram of a programmable metallization memory cell having two filament placement structures.

FIGS. 4 and 5 illustrate embodiments of programmable metallization memory cells of this disclosure, the memory cells including at least one filament placement structure. In FIG. 4, memory cell 40 includes a first metal contact 42, a second metal contact 44, and an ion conductor solid electrolyte material 46 therebetween. Present on first metal contact 42 is a filament placement structure 45, which extends from first metal contact 42 toward second metal contact 44. Upon application of an electric field EF+ across metal contact 44, cations from metal contact 44 migrate toward first metal contact 42, forming conducting filaments 48 or superionic clusters within ion conductor solid electrolyte material 46. Filament placement structure 45 provides an anchor, node or seed for growth of filament 48 from metal contact 42. In FIG. 5, memory cell 50 includes a first metal contact 52, a second metal contact 54, and an ion conductor solid electrolyte material 56 therebetween. Present on first metal contact 52 is a filament placement structure 55, which extends from first metal contact 52 toward second metal contact 54. Present on second metal contact 54 is a filament placement structure 57, which extends from second metal contact 54 toward first metal contact 52. Upon application of an electric field EF+ across metal contact 54, cations from metal contact 54 migrate toward first metal contact 52, forming conducting filaments 58 or superionic clusters within ion conductor solid electrolyte material 56. Filament placement structures 55, 57 provide an anchor, node or seed for growth of filament 58 from metal contact 52 and metal contact 54, respectively.

The inclusion of filament placement structures 45, 55, 57 improve the reliability and reproducibility of memory cells 40, 50 by providing an anchor for filament 48, 58, respectively. In most embodiments, filament 48, 58 does not differ physically or chemically from a filament formed directly between electrodes (i.e., one that does not utilize filament placement structures). The length of filament 48, 58, and thus the distance between filament placement structure 45 and electrode 44 and between filament placement structure 55 and filament placement structure 57 is generally about 5-20 nm, for example about 10-15 nm. The height of filament placement structure 45, 55, 57 above its respective elements 42, 52, 54 is at least about 2 nm, in some embodiments at least about 5 nm, and in other embodiments at least about 10 nm. Filament placement structure 45, 55, 57 may be, for example, about 10-20 nm high or, for example, about 10-30 nm high. In some embodiments, filament placement structure 45, 55, 57 may be at least 25 nm high or at least about 50 nm high. The width of filament placement structure 45, 55, 57 proximate electrode 42, 52, 54, respectively, is generally about 5-50 nm, in some embodiments about 10-20 nm, or about 10 nm in some embodiments. In many embodiments, filament placement structure 45, 55, 57 has a triangular or pyramidal shape, but will vary depending on the method of forming the structure. In some embodiments, the width of filament placement structure 45, 55, 57 is the same as or similar to its height.

By including filament placement structures within programmable memory cells, the resulting position of conducting filaments can be controlled. Additionally, the number of filaments per cell (i.e., the filament density) can be better controlled, as can the dimensions of the filament and the path it takes through the ion conductor solid electrolyte material. The following discussion provides various methods for forming memory cells with filament placement structures. The characteristics of the resulting memory cells (e.g., materials, shapes, sizes, etc.) are the same or similar as described above, unless indicated otherwise.

Figure 6A:
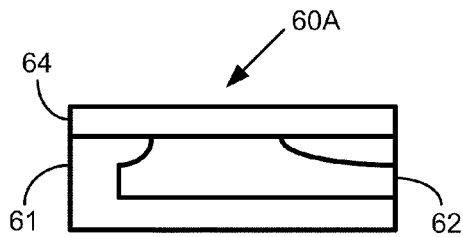
FIGS. 6A-6H are stepwise, side view schematic diagrams illustrating a method of making a programmable metallization memory cell having a filament placement structure.
Figure 6B:
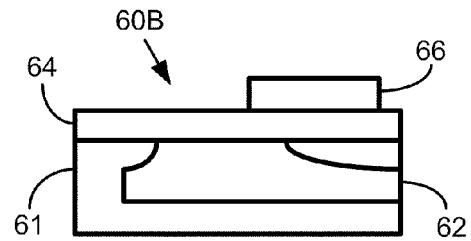
Figure 6C:
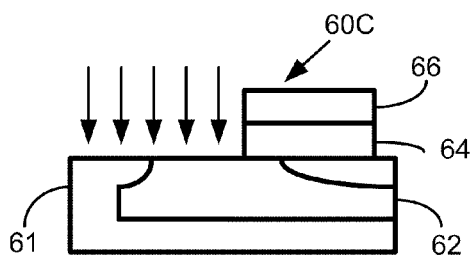
Figure 6D:
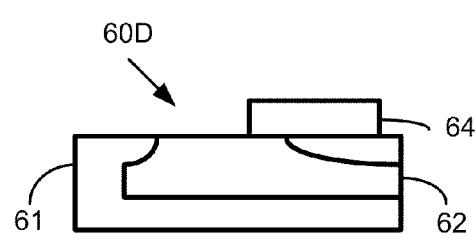
Figure 6E:
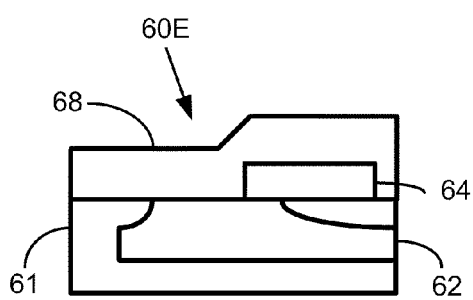
Figure 6F:
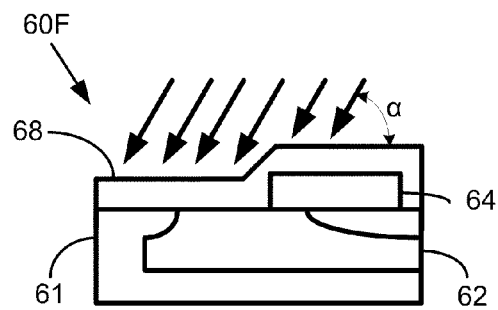
Figure 6G:
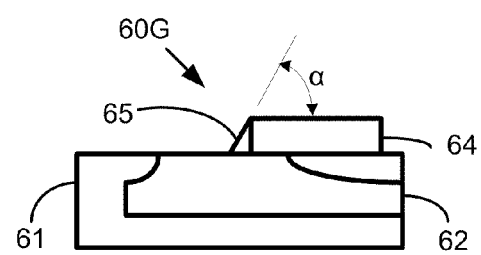
Figure 6H:
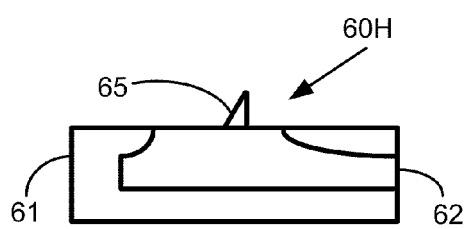

FIGS. 6A-6H illustrate stepwise a method for making a filament placement structure on a metal contact. In FIG. 6A, a structure 60A is prepared by conventional methods (e.g., deposition). Structure 60A has an insulator 61 (e.g., $AlO_x$) supporting an electrode 62 (e.g., Pt, Cu, W, Ni), over which is a hard mask material 64. Diamond-like-carbon (DLC) is a suitable material for hard mask material 64. In FIG. 6B, a photo resist mask 66 is applied over a portion of hard mask material 64 to form structure 60B. Photo resist 66 is positioned so that at least a portion of electrode 62 is not covered by photo resist 66. In FIG. 6C, that portion of hard mask 64 not covered by photo resist 66 is removed, for example, by isotropic plasma etching (e.g., with $O_2$ and He or other inert gas), to form structure 60C. The resulting joint edge of photo resist 66 and hard mask 64 is vertical, perpendicular in relation to electrode 62. In FIG. 6D, photo resist 66 is removed to expose hard mask 64 and form structure 60D. In FIG. 6E, a metallic layer 68 is deposited over electrode 62 and hard mask 64 to form structure 60E. This metallic material could be Pt, Cu, W, or Ni. In FIG. 6F, structure 60E from FIG. 6E is subjected to static milling to remove a portion of metallic layer 68. The milling is done at an angle α in respect to metallic layer 68. In FIG. 6F, a portion of metallic layer 68 has been removed to form structure 60F. Upon completion of the static milling, the resulting structure 60G is shown in FIG. 6G. The majority of metallic layer 68 has been removed, so that a portion of layer remains, which forms a filament placement structure 65. Filament placement structure 65 is that portion of metallic layer 68 that had been shaded or shadowed by hard mask 64. Filament placement structure 65 has an exposed edge that forms an angle α with hard mask 64 and with electrode 62. When using static milling, the height of filament placement structure 65 is essentially the same as the height or thickness of hard mask 64. After removal of hard mask 64, for example by chemical etching, the resulting structure is 60H in FIG. 6H.

Another method of making a filament placement structure is illustrated in FIGS. 7A through 7D. Unlike the method of FIGS. 6A through 6G which utilized static milling, the method of FIGS. 7A through 7D uses rotational milling, where either the construction being milled or the milling apparatus is rotated in a continuous 360 degrees.

Figure 7A:
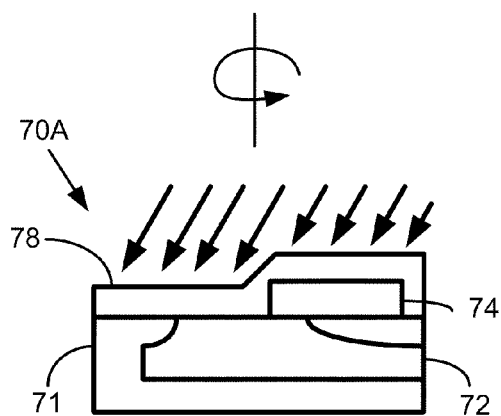
FIGS. 7A-7B are stepwise, side view schematic diagrams illustrating an alternate partial method of making a programmable metallization memory cell having a filament placement structure.
Figure 7B:
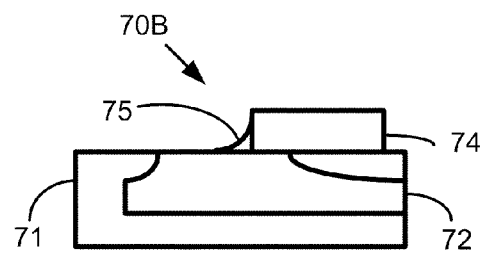
Figure 7C:
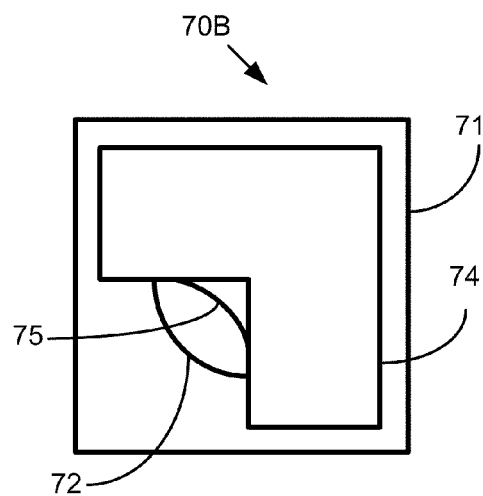
FIGS. 7C-7D are stepwise, top views schematic diagrams illustrating the alternate method of making the programmable metallization memory cell.
Figure 7D:
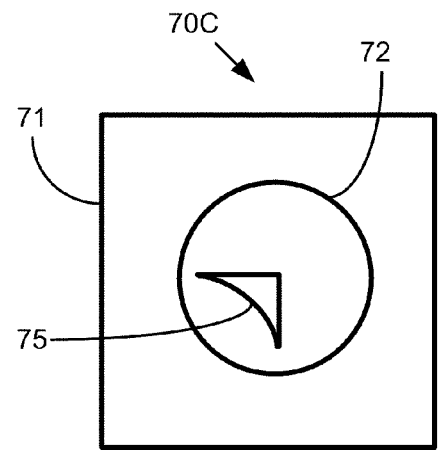

FIG. 7A illustrates a structure 70A similar to structure 60F of FIG. 6F, having an insulator 71 (e.g., $AlO_x$) supporting an electrode 72 (e.g., Pt, Cu, W, Ni), over which is a hard mask material 74 (e.g., DLC) and a metallic layer 78. In FIG. 7A, a portion of metallic layer 78 is removed via rotational milling. The resulting structure 70B is illustrated in FIG. 7B and in FIG. 7C. The majority of metallic layer 78 has been removed with only a filament placement structure 75 remaining Filament placement structure 75 is that portion of metallic layer 78 that had been shadowed by hard mask 74. Due to the rotational milling, filament placement structure 75 has a concave surface, both in the vertical and lateral directions, and the height of filament placement structure 75 is less than the height or thickness of hard mask 74. After removal of hard mask 64, for example by chemical etching, the resulting structure is 70C in FIG. 7D.

The two methods described above provided a single filament placement structure on an electrode. The following discussion provides two methods for forming a plurality of filament placement structures simultaneously.

Figure 8A:
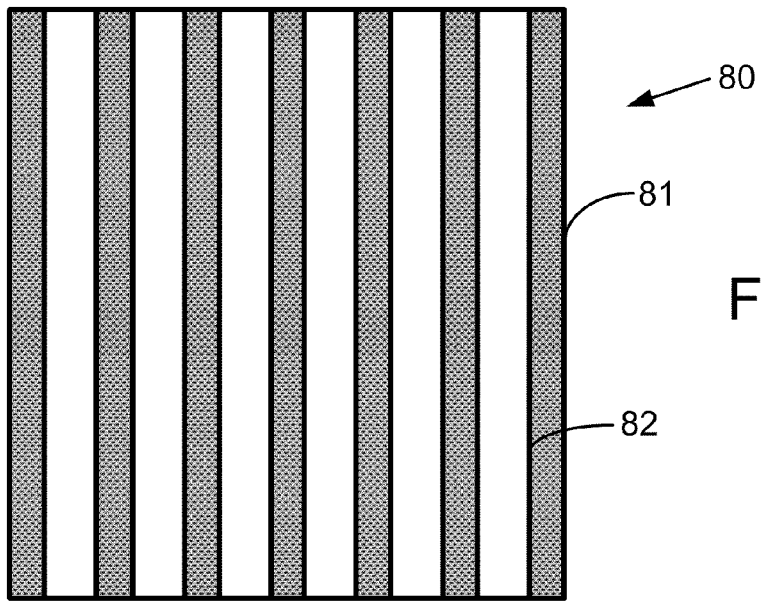
FIGS. 8A-8F are stepwise schematic diagrams illustrating another method of making a programmable metallization memory cell having a filament placement structure, with FIGS. 8A and 8C-8F being top views and FIG. 8B being a side view.
Figure 8B:
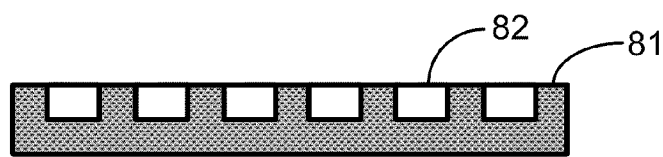
Figure 8C:
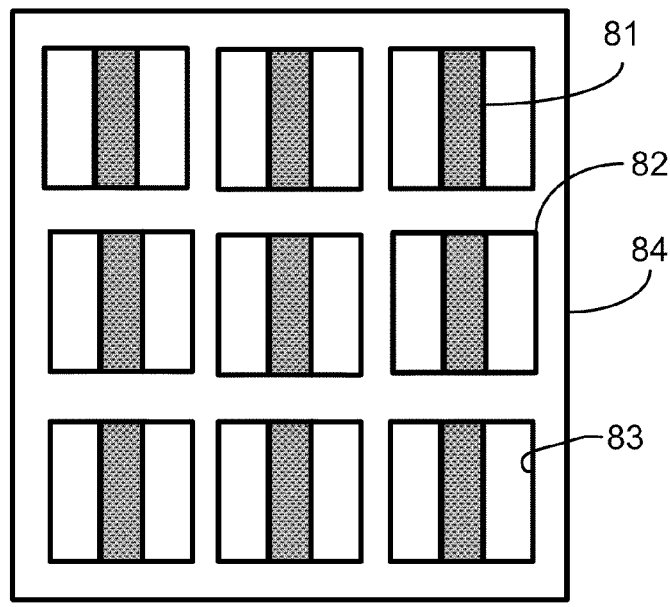
Figure 8D:
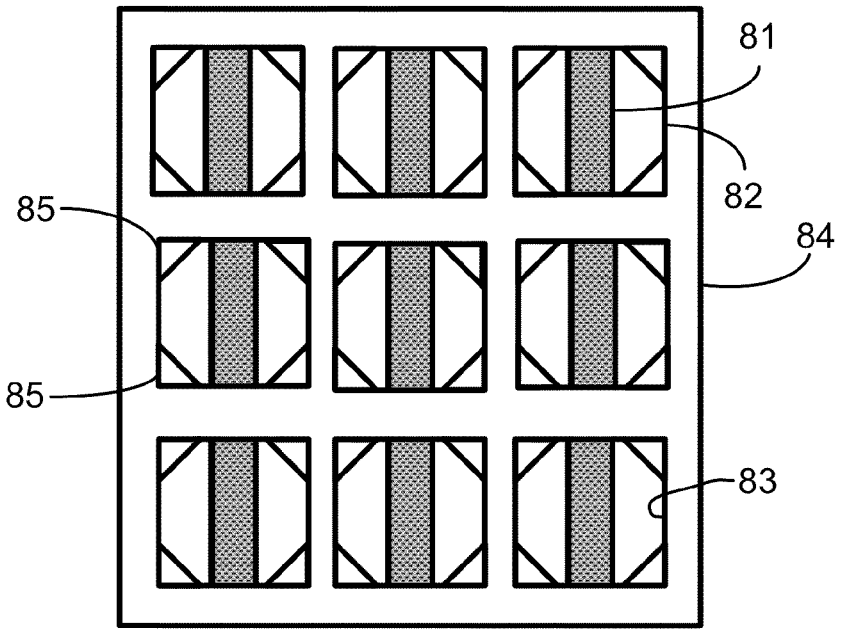
Figure 8E:
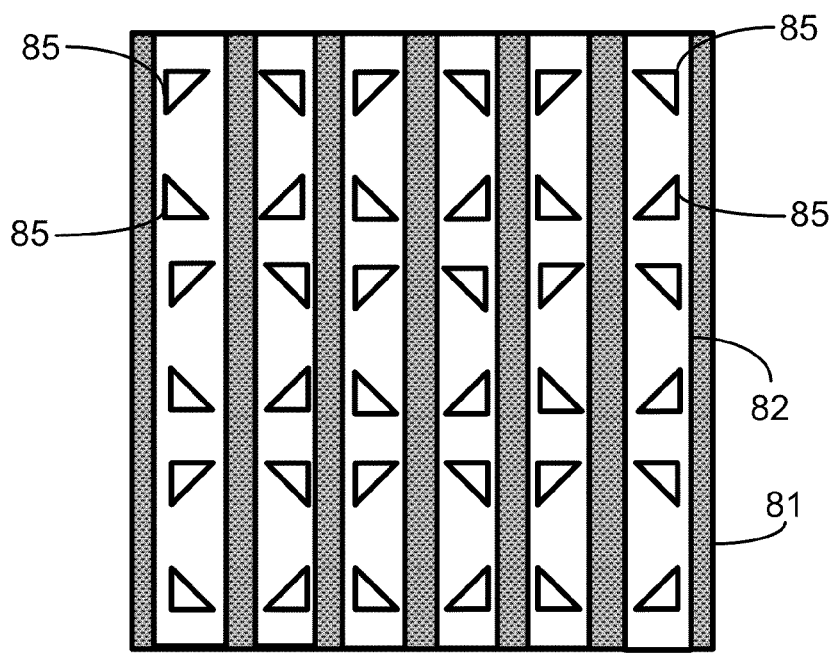
Figure 8F:
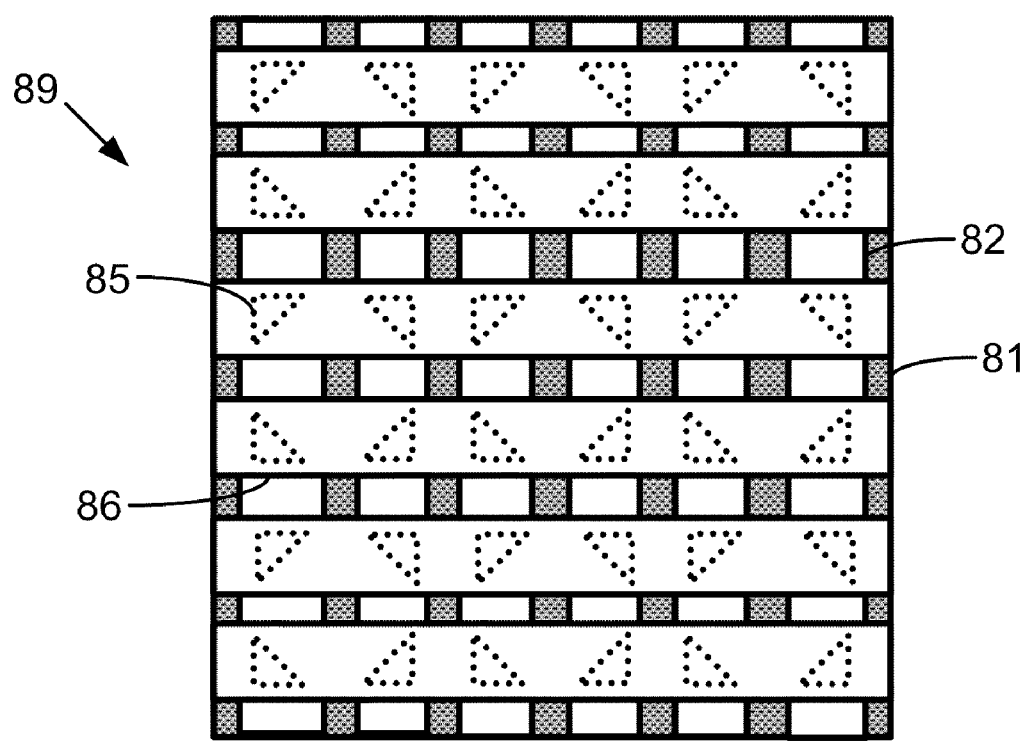

FIGS. 8A through 8F provide a method where a plurality of individual filament placement structures are made. First, a structure 80 is formed having an insulator 81 and a plurality of elongate electrodes 82; FIGS. 8A and 8B illustrate structure 80. In FIG. 8C, a hard mask material 84 is applied over insulator 81 and electrodes 82, leaving open apertures 83 free of mask material 84. Portions of insulator 81 and electrodes 82 are exposed through apertures 83. A metallic material layer is deposited or otherwise applied over mask material 84 and the exposed insulator 81 and electrodes 82. With rotational milling, the majority of metallic layer is removed, leaving a filament placement structure 85 in each corner of apertures 83, as illustrated in FIG. 8D. In alternate embodiments, isotropic plasma etching may be used to remove portions of the metallic layer. After removal of hard mask 84, for example by chemical etching or plasma etching, the resulting structure is illustrated in FIG. 8E. Second electrodes 86 are formed (e.g., deposited) in FIG. 8F over filament placement structures 85, for example, orthogonal to electrodes 82, to provide array structure 89. In some embodiments, array structure 89 may be referred to as a memory array, with first electrodes 82 being word lines and second electrodes 86 being bit lines, or vice versa.

Figure 9A:
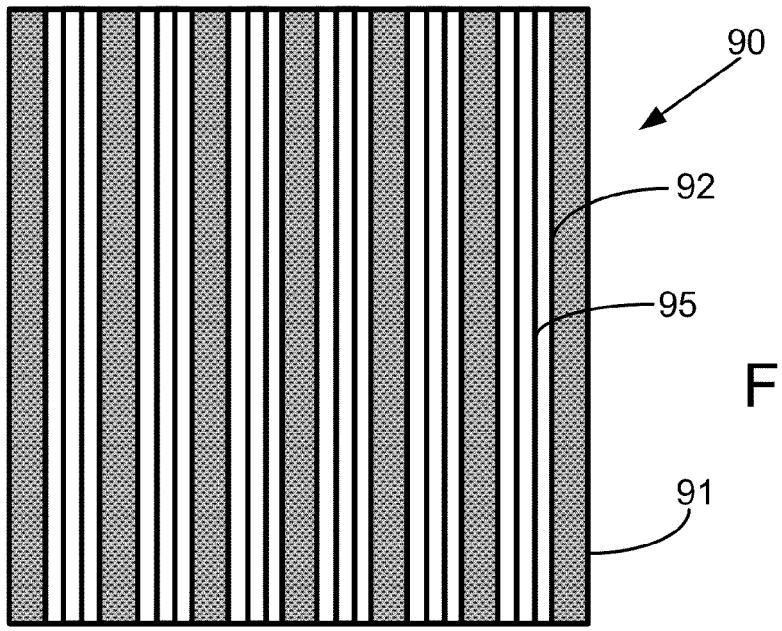
FIGS. 9A-9E are stepwise schematic diagrams illustrating another method of making a programmable metallization memory cell having a filament placement structure, with FIGS. 9A and 9C-9E being top views and FIG. 9B being a side view.
Figure 9B:
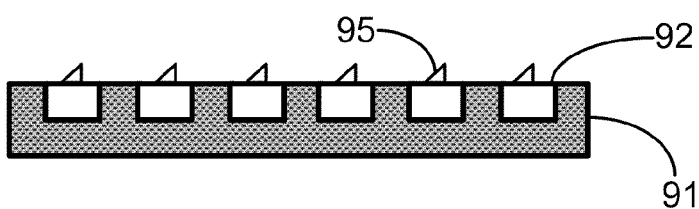
Figure 9C:
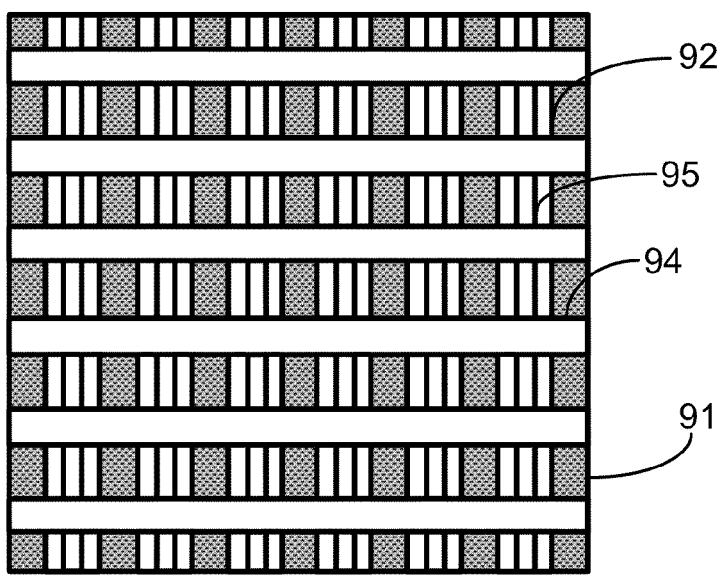
Figure 9D:
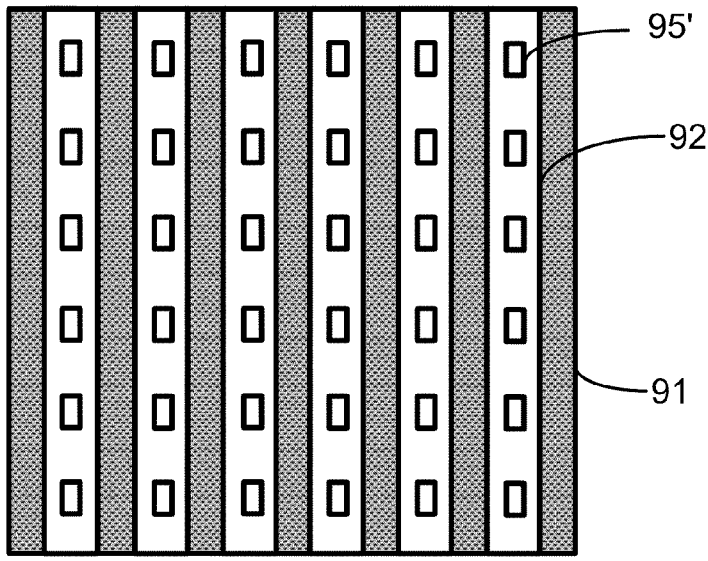
Figure 9E:
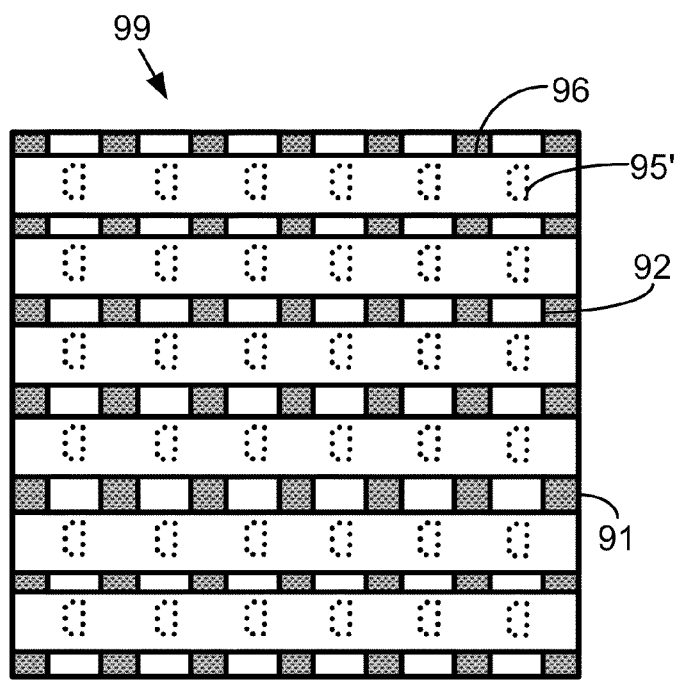

FIGS. 9A through 9E provide a method where a plurality of elongate filament structures are made and then reduced to individual filament placement structures. First, a structure 90 is formed having an insulator 91 and a plurality of elongate electrodes 92 on which extend elongate filament structures 95; FIGS. 9A and 9B illustrate structure 90. Elongate structures 95 may be formed, for example, by the method described above in reference to FIGS. 6A through 6H. Alternately, elongate structures 95 may be formed by directional deposition of metallic material against a mask material, which is removed to obtain structure 90. In FIG. 9C, strips of mask material 94 (either a hard mask material such as DLC or a photo resist) are applied (generally orthogonally) over insulator 91, electrodes 92, and elongate structures 95, leaving portions of insulator 91, electrodes 92, and elongate structures 95 exposed. The exposed elongate structure 95 is removed, for example, by static or rotational milling. After removal of mask material 94, the resulting structure, with individual filament placement structures 95' is illustrated in FIG. 9D. Second electrodes 96 are formed (e.g., deposited) in FIG. 9E over filament placement structures 95', for example, orthogonal to electrodes 92 to provide array structure 99. In some embodiments, array structure 99 may be referred to as a memory array, with first electrodes 92 being word lines and second electrodes 96 being bit lines, or vice versa.

The description above has provided various methods for forming a filament placement structure on an electrode. This electrode may be incorporated into a programmable memory cell to provide a memory cell having one filament placement structure. Memory cell 40 of FIG. 4 is an exemplary memory cell having filament placement structure 45 on electrode 42. Alternately, an electrode having a filament placement structure thereon may be combined with a second filament placement structure, one a second electrode, to provide a memory cell having a filament placement structure on each of two electrodes. Memory cell 50 of FIG. 5 is an exemplary memory cell having filament placement structure 55 on electrode 52 and filament placement structure 57 on electrode 54. FIGS. 10A through 10G provide a method for forming a second filament placement structure on an electrode opposite a first filament placement structure.

Figure 10A:
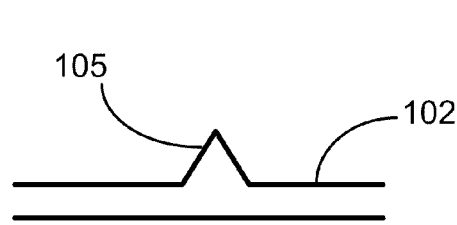
FIGS. 10A-10G are stepwise, side view schematic diagrams illustrating a partial method of making a programmable metallization memory cell having two filament placement structures.
Figure 10B:
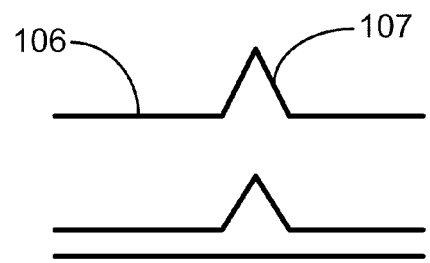
Figure 10C:
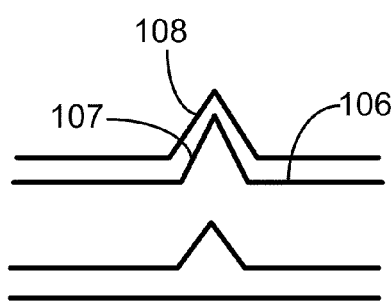
Figure 10D:
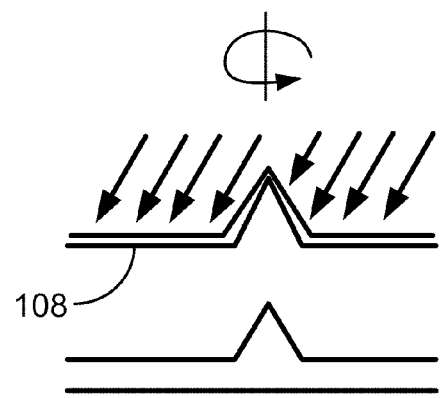
Figure 10E:
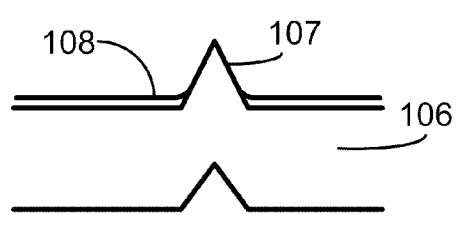
Figure 10F:
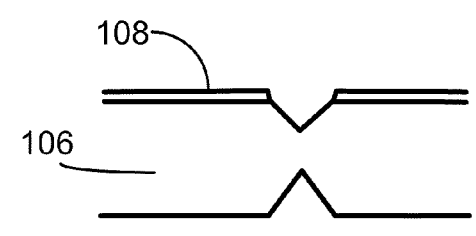
Figure 10G:
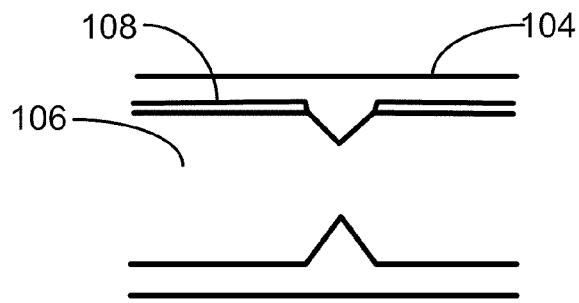
Figure 11:
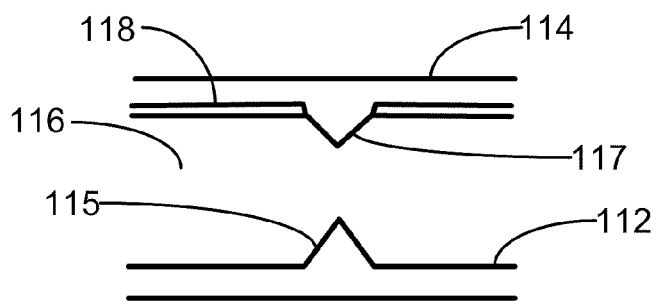
FIG. 11 is a schematic side view diagram of the programmable metallization memory cell made by the method of FIGS. 10A-10G.

In FIG. 10A, a filament placement structure 105 is present on a first electrode 102; filament placement structure 105 could have been formed by any of the previously described methods or by an alternate method. In FIG. 10B, a fast ion conductor 106 such as a chalcogenide-type or an oxide-type (e.g., NiO) material is applied over electrode 102 and structure 105. Fast ion conductor 106 follows the contour of electrode 102 and structure 105, thus resulting in a protuberance 107. A hard mask material 108 (e.g., DLC) is applied over fast ion conductor 106 and protuberance 107 in FIG. 10C. In FIG. 10D, the structure is rotationally milled, resulting in a portion of hard mask material 108 being removed. The angle of milling is preferably about 30-60 degrees from vertical, in some embodiments preferably about 45 degrees from vertical, depending on the configuration of protuberance 107 and the mask material 108 thereon. A 90 degree (orthogonal) impact of the milling ions onto a surface generally removes material at a higher rate than other angles of impact. Thus, the milling is preferably done at an angle to remove mask material 108 from protuberance 107 while leaving some mask material 108 on fast ion conductor 106, as illustrated in FIG. 10E. Continued milling results in removal of the exposed portion of fast ion conductor 106, resulting in a depression in fast ion conductor 106, as illustrated in FIG. 10F. In FIG. 10G, mask material 108 is coated with a metallic layer 104, which also fills in the depression in fast ion conductor 106. The resulting structure 110, in FIG. 11, has a first electrode 112 having a filament placement structure 115 extending into a fast ion conductor 116. Structure 110 also has a second electrode 114 having a filament placement structure 117 extending into fast ion conductor 116. A hard mask layer 118, which may be electrically conductive material, is positioned between second electrode 114 and fast ion conductor 116.

Figures 12A, 12B:
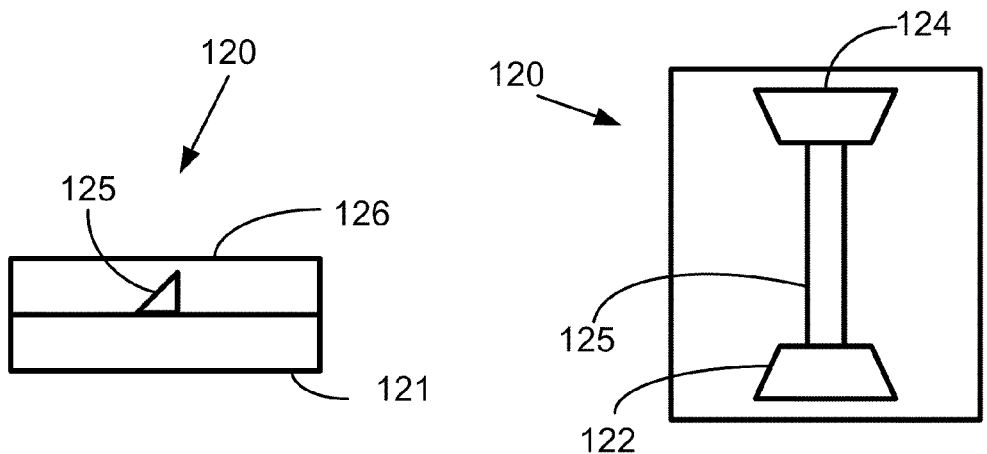
FIG. 12A is a schematic side view diagram and FIG. 12B is a schematic top view diagram of an alternate programmable memory cell.

An alternate configuration of a memory cell is illustrated in FIGS. 12A and 12B as memory cell 120. Memory cell 120 has an insulator 121 (e.g., $AlO_x$) with a first contact or electrode 122 and a second contact or electrode 124 present thereon. Electrically connected to and extending between electrodes 122, 124 is a placement structure 125. Placement structure 125 can be made by any of the techniques described above, typically utilizing static milling rather than rotational milling. A fast ion conductor 126 covers insulator 121, electrodes 122, 124 and placement structure 125. In some embodiments, placement structure 125 has a size (i.e., height and width) that is less than the diameter of a conductive filament or superionic cluster that would form between electrodes 122, 124 when an appropriate voltage is applied.

Upon application of a voltage across electrodes 122, 124 thus resulting in an electric field, a conducting filament or superionic cluster will grow proximate (e.g., around) placement structure 125 between electrode 122 and electrode 124, closely following the path defined by placement structure 125. Memory cell 120 will thus be in the low resistance state. Reset processing with a field of opposite polarity, or with a reset voltage or current will dissolve the metallic filament, leaving the placement structure 125 in the high resistance state. With such a design, having placement structure 125 connecting electrodes 122, 124, the occurrence of only one filament between electrodes 122, 124 is greatly increased.

In an alternate configuration, due to the presence of placement structure 125 connecting electrodes 122, 124, memory cell 120 is initially in a low resistance state, due to structure 125 providing an electrical path between electrodes 122, 124. Upon application of a sufficiently high voltage, placement structure 125 may be dissolved or disrupted, thus creating a high resistance of memory cell 120. Subsequent application of voltage may reform a filament between electrodes 122, 124.

Thus, embodiments of the PROGRAMMABLE RESISTIVE MEMORY CELL WITH FILAMENT PLACEMENT STRUCTURE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A programmable metallization memory cell comprising:
a first metal contact and a second metal contact;
a chalcogenide-type material between the first metal contact and the second metal contact; and
metallic filament placement structures present on both the first metal contact and the second metal contact and extending into the chalcoenide-type material, wherein the distance between the filament placement structure located on the first metal contact and the second metal contact is from about 5 to about 20 nm.

2. The memory cell of claim 1 wherein the filament placement structure has a height of at least about 2 nm.

3. The memory cell of claim 1 wherein the width of the filament placement structure is about 5 to 50 nm.

4. The memory cell of claim 1 wherein the filament placement structure comprises Pt, Cu, W, or Ni.

5. The memory cell according to claim 1, wherein the chalcogenide-type material is selected from $GeS_2$, $GeSe_2$, or $CuS_2$.

6. A programmable metallization memory cell comprising:
a first metal contact and a first filament placement structure present on the first metal contact;
a second metal contact and a second filament placement structure present on the second metal contact;
an ion conductor solid electrolyte material between the first metal contact and the second metal contact,
wherein the first and second filament placement structures extend into the ion conductor material.

7. The memory cell of claim 6 wherein the first filament placement structure and the second filament placement structure have a distance of about 5 to 20 nm therebetween.

8. The memory cell of claim 6 wherein the first and second filament placement structures have heights of at least about 2 nm.

9. The memory cell of claim 6 wherein the first and second filament placement structures have heights of at least about 10 nm.

10. The memory cell of claim 6 wherein the width of the first and second filament placement structures is about 5 to 50 nm.

11. The memory cell of claim 6 wherein the first and second filament placement structures are metallic.

12. The memory cell of claim 11 wherein the first and second filament placement structures independently comprise Pt, Cu, W, or Ni.

13. A memory array comprising a plurality of memory cells according to claim 6, wherein the plurality of cells are arranged in columns and rows, and wherein the first metal contacts in each row are word lines and the second metal contacts in each column are bit lines.

14. The memory array according to claim 13 wherein the first and second filament placement structures are metallic.

15. The memory array according to claim 14, wherein the first and second filament placement structures independently comprise Pt, Cu, W, or Ni.

16. The memory array of claim 13 wherein the width of the first and second filament placement structures are about 5 to 50 nm.

* * * * *